United States Patent
Sato et al.

(10) Patent No.: US 9,116,213 B2
(45) Date of Patent: Aug. 25, 2015

(54) SECONDARY BATTERY STATE DETECTING DEVICE AND SECONDARY BATTERY STATE DETECTING METHOD

(71) Applicants: Etsuzo Sato, Shiga (JP); Hideaki Ishihara, Shiga (JP); Fukuda Kazumi, Tokyo (JP); Naoki Ishiyone, Tokyo (JP)

(72) Inventors: Etsuzo Sato, Shiga (JP); Hideaki Ishihara, Shiga (JP); Fukuda Kazumi, Tokyo (JP); Naoki Ishiyone, Tokyo (JP)

(73) Assignees: HONDA MOTOR CO., LTD., Tokyo (JP); FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 118 days.

(21) Appl. No.: 13/847,985

(22) Filed: Mar. 20, 2013

(65) Prior Publication Data

US 2013/0253730 A1    Sep. 26, 2013

(30) Foreign Application Priority Data

Mar. 21, 2012 (JP) ................................ 2012-064609

(51) Int. Cl.
*G01R 31/36* (2006.01)

(52) U.S. Cl.
CPC ........ *G01R 31/3606* (2013.01); *G01R 31/3693* (2013.01); *G01R 31/3662* (2013.01)

(58) Field of Classification Search
CPC .......... B60R 16/04; H02J 7/00; H01M 10/48; G01R 31/36; G01R 31/3606; G01R 31/3693; G01R 31/3662
USPC ............................................................ 701/1
See application file for complete search history.

(56) References Cited

FOREIGN PATENT DOCUMENTS

| JP | 2003068370 | A |   | 3/2003 |
|----|------------|---|---|--------|
| JP | 2007038795 | A |   | 2/2007 |
| JP | 2007-55506 |   |   | 3/2007 |
| JP | 2007055506 | A | * | 3/2007 |
| JP | 2007083965 | A |   | 4/2007 |
| JP | 4012644    | B2|   | 11/2007|
| JP | 2007292666 | A |   | 11/2007|
| JP | 2007309100 | A |   | 11/2007|
| JP | 2008232038 | A |   | 10/2008|
| JP | 4849074    | B2|   | 12/2011|
| WO | 2009118904 | A1|   | 10/2009|

* cited by examiner

*Primary Examiner* — James Trammell
*Assistant Examiner* — James E Stroud
(74) *Attorney, Agent, or Firm* — Amin, Turocy & Watson, LLP

(57) ABSTRACT

A current detecting unit (current sensor 12) detecting a current value of a current flowing in a secondary battery 14; an extreme value detecting unit (CPU 10a) detecting a first extreme value of a current after an inrush current flows from the secondary battery to a starter motor after electricity to the starter motor is turned on based on the current value; an inflection point detecting unit (CPU 10a) detecting a first inflection point of the current after the inrush current flows based on a variation of the current value per a predetermined time; and a calculation unit (CPU 10a) selecting the inflection point when timings when the extreme value and the inflection point are detected are separated for a predetermined time or more, and selecting either one of the extreme value or the inflection point in the other cases to set as a starting current, and calculating a starting voltage from the starting current, an internal resistance of the secondary battery, and a voltage before starting being a voltage of the secondary battery before the electricity to the starter motor is turned on, are included.

6 Claims, 8 Drawing Sheets

FIG.3A
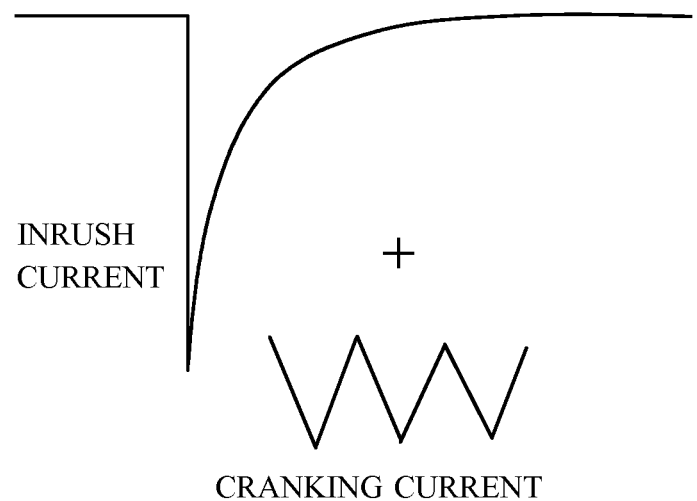
INRUSH CURRENT
CRANKING CURRENT
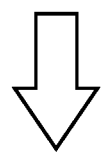
FIG.3B
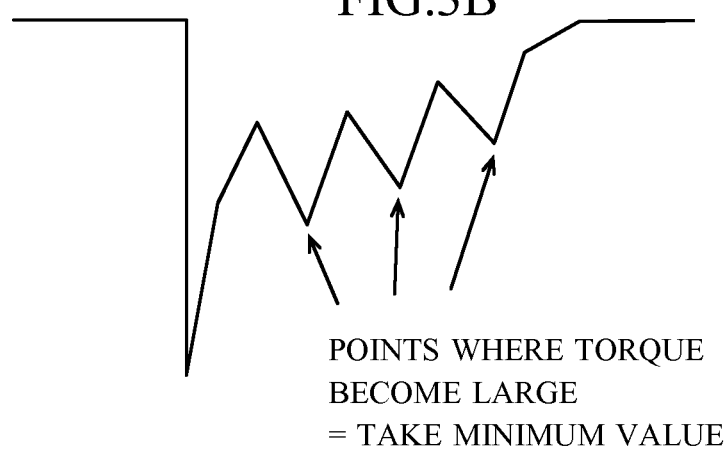
POINTS WHERE TORQUE BECOME LARGE
= TAKE MINIMUM VALUE

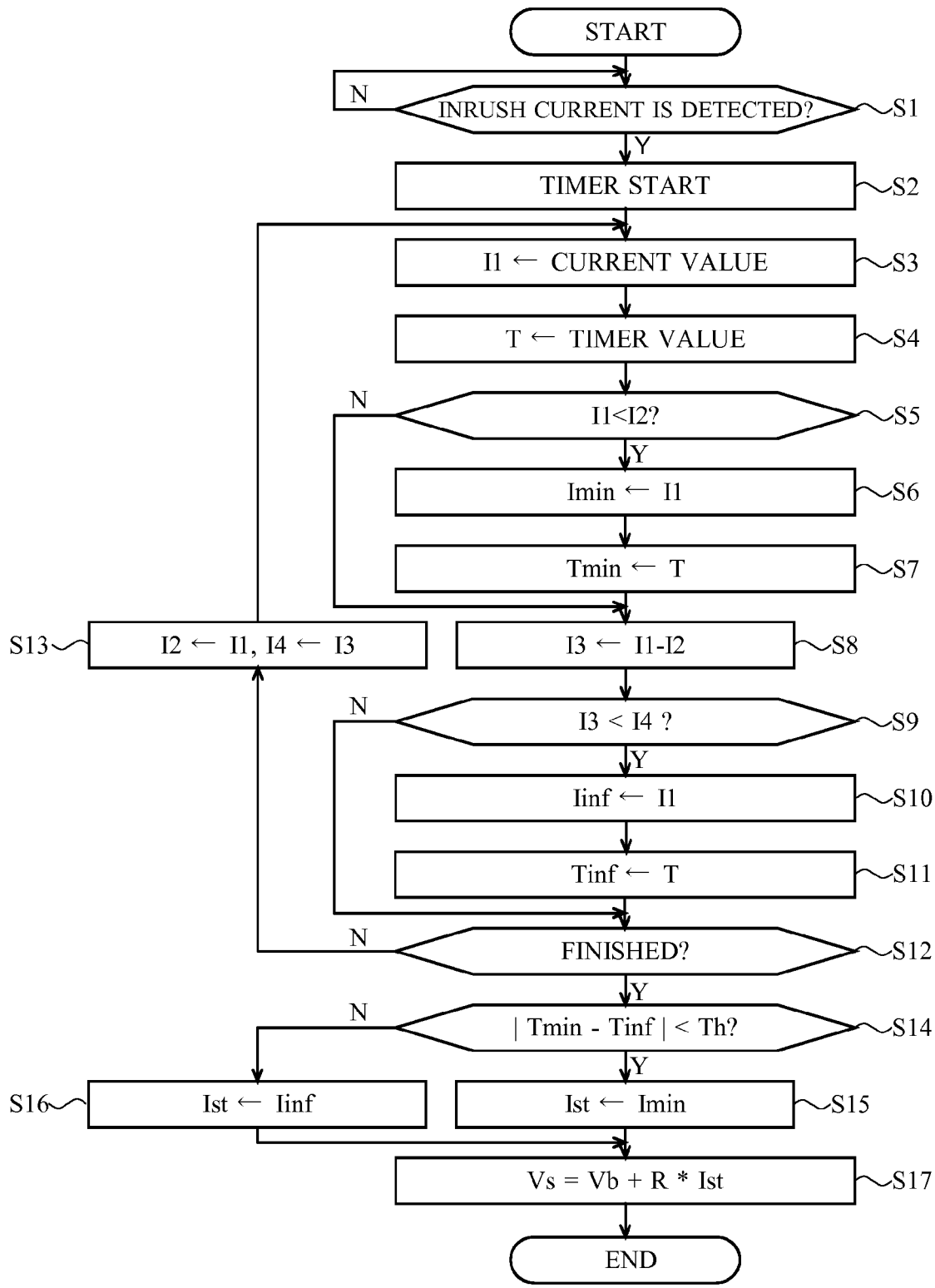

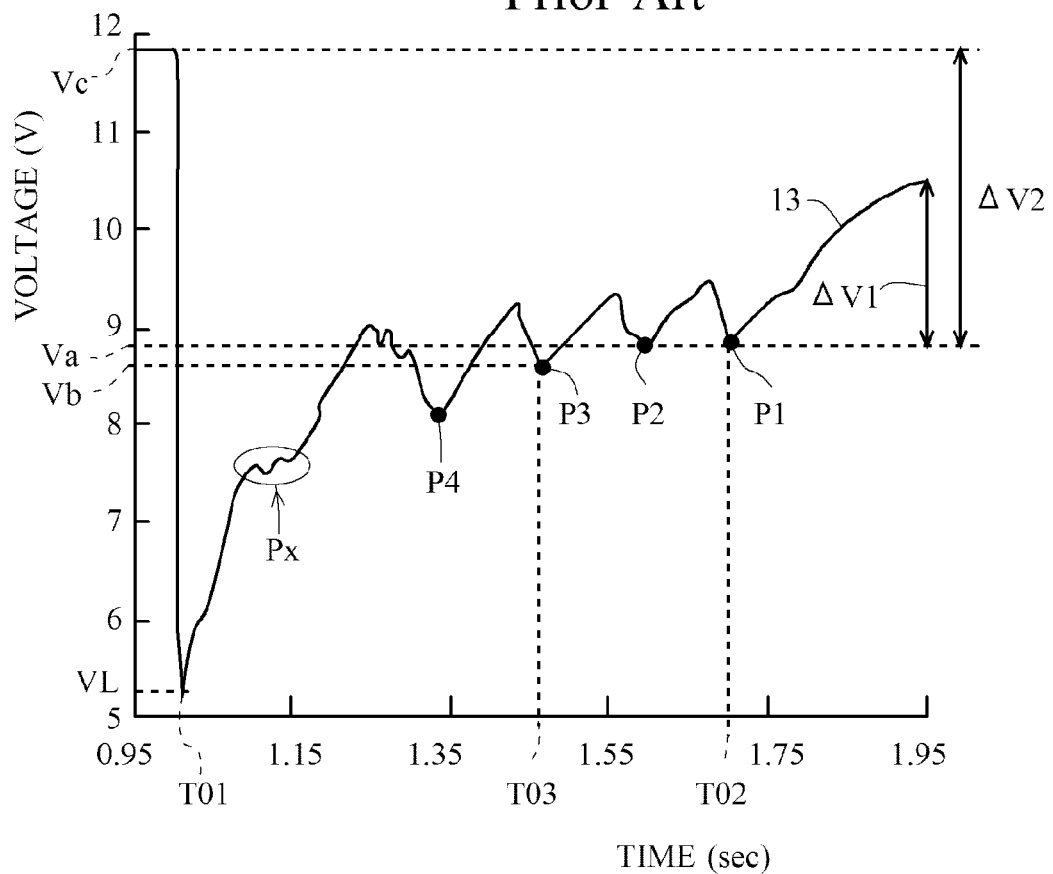

SECONDARY BATTERY STATE DETECTING DEVICE AND SECONDARY BATTERY STATE DETECTING METHOD

CROSS-REFERENCE TO RELATED APPLICATION

This application claims priority to Japanese Patent Application Serial No. 2012-064609, filed on Mar. 21, 2012, the entirety of which is incorporated herein by reference.

BACKGROUND OF THE INVENTION

1. Field of the Invention

The present invention relates to a secondary battery state detecting device and a secondary battery state detecting method.

2. Description of the Related Art

An art, defined as "[Patent Document 1] Japanese Patent Application Laid-open No. 2007-55506" and referenced herein as "[Patent Document 1]", discloses judging a state of a secondary battery based on a voltage at each timing during a period from start to end of cranking to judge whether or not starting of engine is possible. FIG. 8 corresponds to FIG. 2 disclosed in the art [Patent Document 1]. In the art [Patent Document 1], it is judged whether or not a voltage when an inrush current flows as represented by a reference sign T01 (as shown in FIG. 8) exceeds an operable voltage of an ECU, and it is judged whether or not a lower voltage between voltages of the secondary battery at an engine fuel injection time T03 and at an engine ignition time T02 exceeds an operable voltage for fuel injection and ignition system. Besides, it is judged whether or not a cranking rotation speed at the engine ignition time T02 is a rotation speed capable of ignition. It is judged whether or not the starting of engine is possible by the three judgments as stated above.

[Patent Document 1] Japanese Patent Application Laid-open No. 2007-55506

SUMMARY OF THE INVENTION

Incidentally, each of points P1 to P4 illustrated in FIG. 8 is a timing when a piston of an engine reaches a top dead center in a compression stroke, and a current reaching a peak flows in a starter motor at each of these timings. The points of P3, P2 are emphasized in the art of Patent Document 1, but the engine cannot be started if a necessary current does not flow at the point P4 when torque is the most required because a rotation of the starter motor cannot be maintained before reaching the points P3 and P2. Besides, there is a case when the piston of the engine reaches the top dead center in the compression stroke at a region indicated by a reference sign Px in FIG. 8 depending on a position of the piston at a start time of engine starting, a kind of the engine, and an external environment (for example, a case when an exhaust rate of the engine is small, and a case when a pressure of the engine at a compression time is lowered caused by aging correspond thereto). In these cases, the current flowing at the region Px becomes the maximum, and therefore, it is impossible to start the engine unless this region is exceeded, but the region Px as stated above is not considered at all in the art of Patent Document 1. Accordingly, there is a problem in which it is impossible to correctly judge whether or not the starting of engine is possible depending on the kind of the engine and an usage environment thereof by the art in Patent Document 1.

Accordingly, an object of the present invention is to provide a secondary battery state detecting device and a secondary battery state detecting method capable of correctly judging whether or not the starting of engine is possible.

To solve the above-stated problems, the present invention is characterized in that: a current detecting unit detecting a current value of a current flowing in a secondary battery; an extreme value detecting unit detecting a first extreme value of a current flowing in a starter motor after an inrush current flows from the secondary battery to the starter motor after electricity to the starter motor starting an engine is turned on based on the current value; an inflection point detecting unit detecting a first inflection point of the current flowing in the starter motor after the inrush current flows based on a variation of the current value per a predetermined time; and a calculation unit selecting the inflection point when timings when the extreme value and the inflection point are detected are separated for a predetermined time or more, and selecting either one of the extreme value or the inflection point in the other cases to set as a starting current, and calculating a starting voltage being a voltage necessary for starting the engine from the starting current, an internal resistance of the secondary battery, and a voltage before starting being a voltage of the secondary battery before the electricity to the starter motor is turned on, are included in a secondary battery state detecting device detecting a state of the secondary battery mounted on a vehicle.

According to the above-stated constitution, it becomes possible to correctly judge whether or not starting of engine is possible based on the starting voltage.

Besides, another invention is characteristics in that the calculation unit selects the extreme value to set as the starting current when the timings when the extreme value and the inflection point are detected are not separated for the predetermined time or more, and calculates the starting voltage from the starting current, the internal resistance of the secondary battery, and the voltage before starting of the secondary battery in addition to the above-stated invention.

According to the above-stated constitution, it becomes possible to correctly find the current at the maximum torque point by selecting the extreme value when the extreme value and the inflection point are not separated for the predetermined time or more.

Besides, the present invention is characterized in that: a current detecting step detecting a current value of a current flowing in a secondary battery; an extreme value detecting step detecting a first extreme value of a current flowing in a starter motor after an inrush current flows from the secondary battery to the starter motor after electricity to the starter motor starting an engine is turned on based on the current value; an inflection point detecting step detecting a first inflection point of the current flowing in the starter motor after the inrush current flows based on a variation of the current value per a predetermined time; and a calculation step selecting the inflection point when timings when the extreme value and the inflection point are detected are separated for a predetermined time or more, and selecting either one of the extreme value or the inflection point in the other cases to set as a starting current, and calculating a starting voltage being a voltage necessary for starting the engine from the starting current, an internal resistance of the secondary battery, and a voltage before starting being a voltage of the secondary battery before the electricity to the starter motor is turned on, are included in a secondary battery state detecting method detecting a state of the secondary battery mounted on a vehicle.

According to the method as stated above, it becomes possible to correctly judge whether or not the starting of engine is possible based on the starting voltage.

According to the present invention, it is possible to provide a secondary battery state detecting device and a secondary battery state detecting method capable of correctly judging whether or not the starting of engine is possible.

BRIEF DESCRIPTION OF THE DRAWINGS

FIGS. 3A and 3B are views illustrating a relationship between an inrush current and a cranking current;

FIG. 7 is a flowchart describing an example of a process executed in the embodiment illustrated in FIG. 1; and FIG. 8 is a view to describe a conventional art.

DETAILED DESCRIPTION OF THE PREFERRED EMBODIMENT(S)

Next, embodiments of the present invention are described.

(A) Description of Configuration of Embodiment

Figure 1:
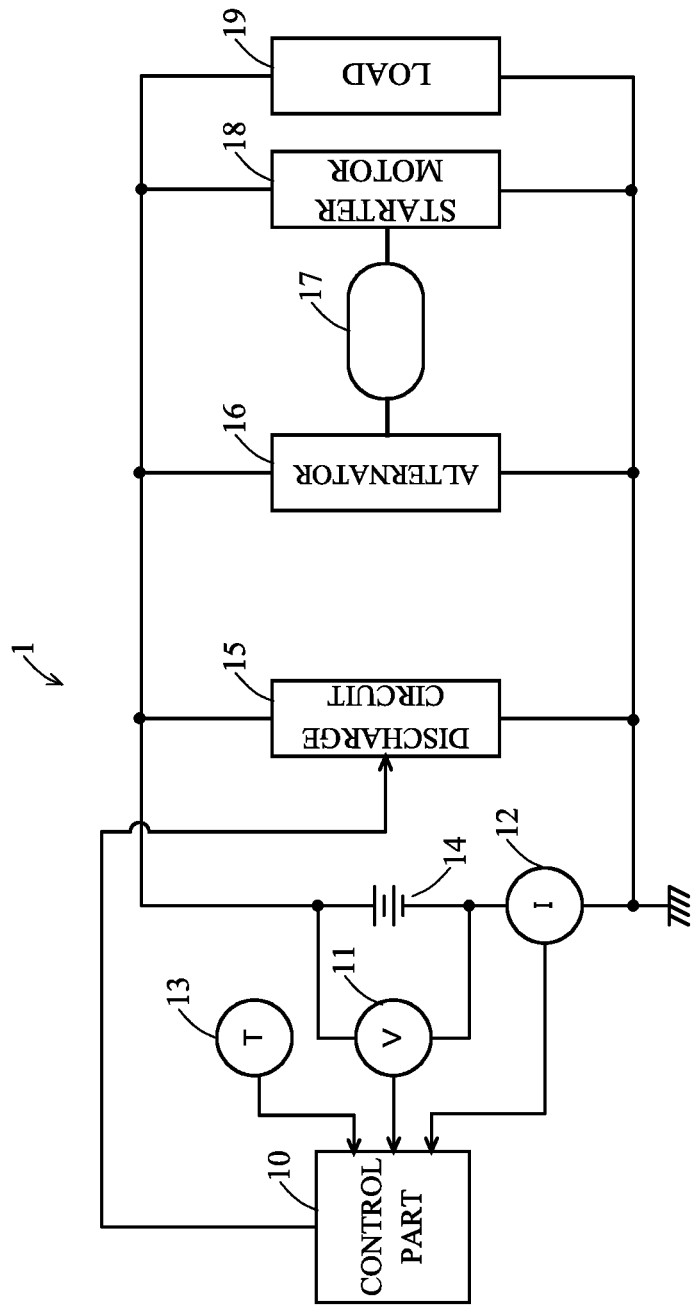
FIG. 1 is a view illustrating a configuration example of a secondary battery state detecting device according to an embodiment of the present invention.

FIG. 1 is a view illustrating a power supply system of a vehicle having a secondary battery state detecting device according to an embodiment of the is present invention. In this drawing, a secondary battery state detecting device 1 includes a control part 10, a voltage sensor 11, a current sensor 12, a temperature sensor 13, and a discharge circuit 15 as major components, and detects a state of a secondary battery 14. Here, the control part 10 refers to outputs from the voltage sensor 11, the current sensor 12, and the temperature sensor 13, and detects the state of the secondary battery 14. The voltage sensor 11 detects a terminal voltage of the secondary battery 14, and notifies the control part 10. The current sensor 12 detects a current flowing in the secondary battery 14, and notifies the control part 10. The temperature sensor 13 detects environmental temperatures of the secondary battery 14 in itself or a periphery thereof, and notifies the control part 10. The discharge circuit 15 is made up of, for example, a semiconductor switch, a resistance element, and so on connected in series, and makes the secondary battery 14 intermittently discharge by the semiconductor switch on/off controlled by the control part 10. The control part 10 finds an internal resistance of the secondary battery 14 from a voltage and a current when the intermittent discharge is performed.

The secondary battery 14 is made up of, for example, a flooded lead-acid battery and so on using lead oxide for a positive electrode (positive plate), spongy lead for a negative electrode (negative plate), and dilute sulfuric acid as electrolytic solution, charged by an alternator 16, starts an engine 17 by driving a starter motor 18, and supplies electric power to a load 19. The alternator 16 is driven by the engine 17, generates an alternating-current power, converts it into a direct-current power by a rectifying circuit, and charges the secondary battery 14.

The engine 17 is made up of, for example, a reciprocal engine such as a gasoline engine and a diesel engine, or a rotary engine, and so on, started by the starter motor 18, drives a driving wheel via a transmission to provide a vehicle with a propulsive force, and generates electric power by driving the alternator 16. The starter motor 18 is made up of, for example, a direct current motor, generates a rotational force by the electric power supplied from the secondary battery 14, and starts the engine 17. The load 19 is made up of, for example, an electric steering motor, a defogger, an ignition coil, a car audio, a car navigation, and so on, and operated by the electric power from the secondary battery 14.

Figure 2:
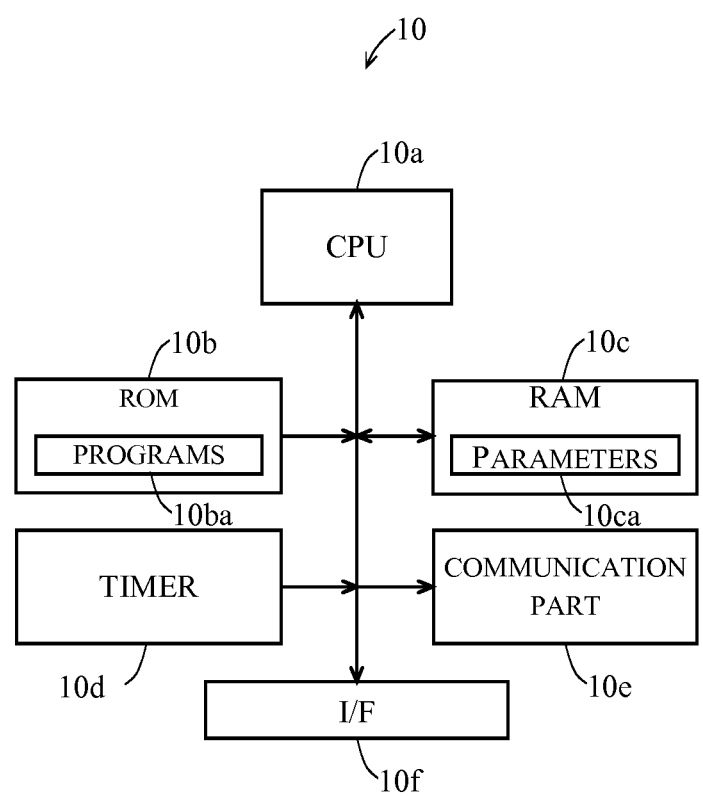
FIG. 2 is a block diagram illustrating a detailed configuration example of a control part illustrated in FIG. 1.

FIG. 2 is a view illustrating a detailed configuration example of the control part 10 illustrated in FIG. 1. As illustrated in the view, the control part 10 includes a CPU (Central Processing Unit) 10a, a ROM (Read Only Memory) 10b, a RAM (Random Access Memory) 10c, a timer 10d, a communication part 10e, and an I/F (Interface) 10f. Here, the CPU 10a controls each part based on programs 10ba stored at the ROM 10b. The ROM 10b is made up of a semiconductor memory, and so on, and stores the programs 10ba, and so on. The RAM 10c is made up of a semiconductor memory, and so on, and stores parameters 10ca generated when the programs 10ba are executed. The timer 10d clocks and outputs a time. The communication part 10e is connected to the other devices (for example, a not-illustrated ECU (Engine Control Unit)) and so on via a communication line, and gives and receives information between the other devices. The I/F 10f converts signals supplied from the voltage sensor 11, the current sensor 12, and the temperature sensor 13 into digital signals, downloads them, and supplies a drive current to the discharge circuit 15 to control it.

(B) Description of Schematic Operations of Embodiment

Next, schematic operations of the embodiment are described with reference to FIGS. 3A, 3B to FIG. 6. In the present embodiment, a starting voltage being a voltage capable of starting the engine 17 is found. Note that the starting voltage can be found by the following expression (1).

$$\text{Starting voltage} = \text{Voltage before starting} + \text{Starting current} \times \text{Internal resistance} \quad (1)$$

Here, the voltage before starting is a voltage of the secondary battery 14 before electricity to the starter motor 18 is turned on, the starting current is a current flowing during the starter motor 18 is rotating, and the internal resistance is an internal resistance component of the secondary battery 14. Note that the internal resistance can be measured based on a voltage and a current when, for example, the secondary battery 14 is intermittently pulse discharged by the discharge circuit 15 during the engine 17 is stopped. It goes without saying that the internal resistance may be found by a method other than the above. Besides, it is desirable that a point when a voltage becomes the lowest except the inrush current during cranking of the engine 17, namely a point when a torque of the starter motor 18 becomes the maximum (hereinafter it is called as a "maximum torque point") is used as the starting current.

Note that it is generally possible to identify the maximum torque point by detecting a minimum value of the current. However, there is a case when it is not appeared as the minimum value depending on a kind of the engine 17, a usage environment, and the other as it is described later. It is described hereinafter as for these cases.

FIGS. 3A, 3B are views illustrating a temporal change of the current flowing from the secondary battery 14 to the starter motor 18 when the engine 17 is started by the starter motor 18. As illustrated in FIG. 3A, a current in which two kinds of currents of the inrush current flowing by connecting the starter motor 18 to the secondary battery 14 (the current illustrated at an upper part in FIG. 3A) and a cranking current flowing by cranking the engine 17 (the current illustrated at a lower part in FIG. 3A) are overlapped flows when the engine 17 is started. Incidentally, the cranking current takes a maximum value (takes a minimum value in FIGS. 3A, 3B) at a point where a piston of the engine 17 reaches a top dead center in a compression stroke (a point where a compression rate becomes the maximum (hereinafter, it is called as a "compression rate maximum point")). Note that a first compression rate maximum point among the compression rate maximum points is the maximum torque point.

Figure 4:
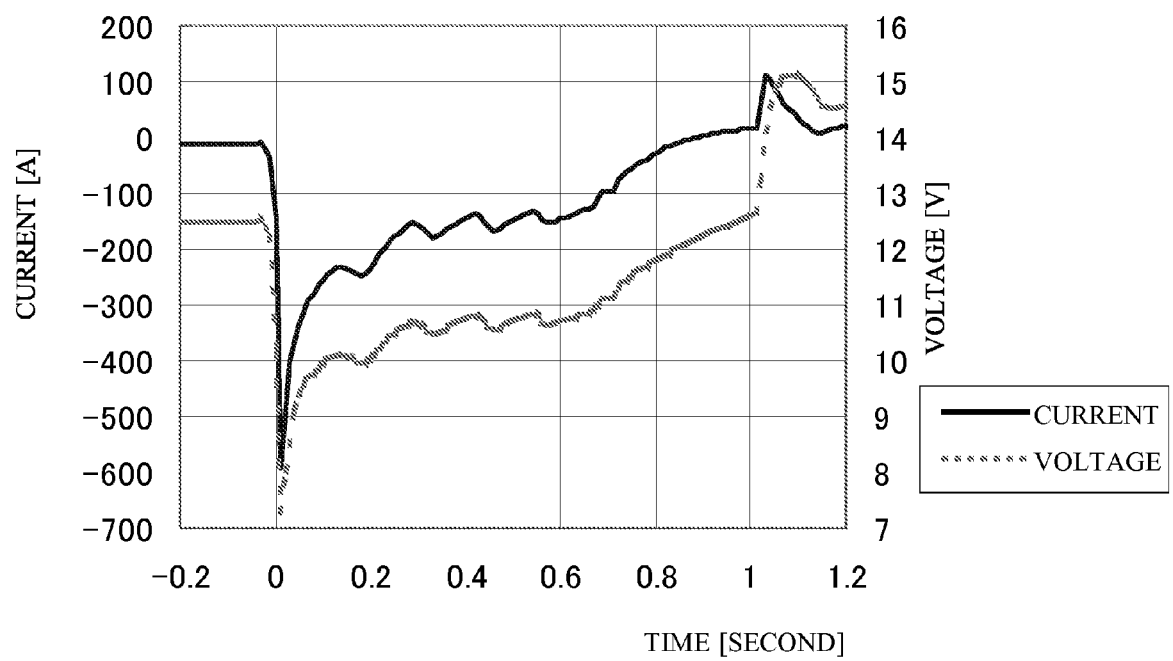
FIG. 4 is a view illustrating a temporal change of a voltage and a current at a starting time.

FIG. 4 is a view illustrating a temporal change of a voltage and a current of the secondary battery 14 at the starting time of the engine 17. As illustrated in FIG. 4, when the electricity to the starter motor 18 is turned on at a time "0" (zero) second, the inrush current at approximately −600 A flows as indicated by a solid line, and the voltage drops to approximately 7 V as indicated by a dotted line according to the inrush current. After that, the starter motor 18 begins to rotate and the cranking of the engine 17 is started, the current indicated by the solid line changes with corresponding to an increase of a pressure inside a cylinder of the engine 17, and takes a minimum value. The minimum values appear four times in the example in FIG. 4.

Figure 5:
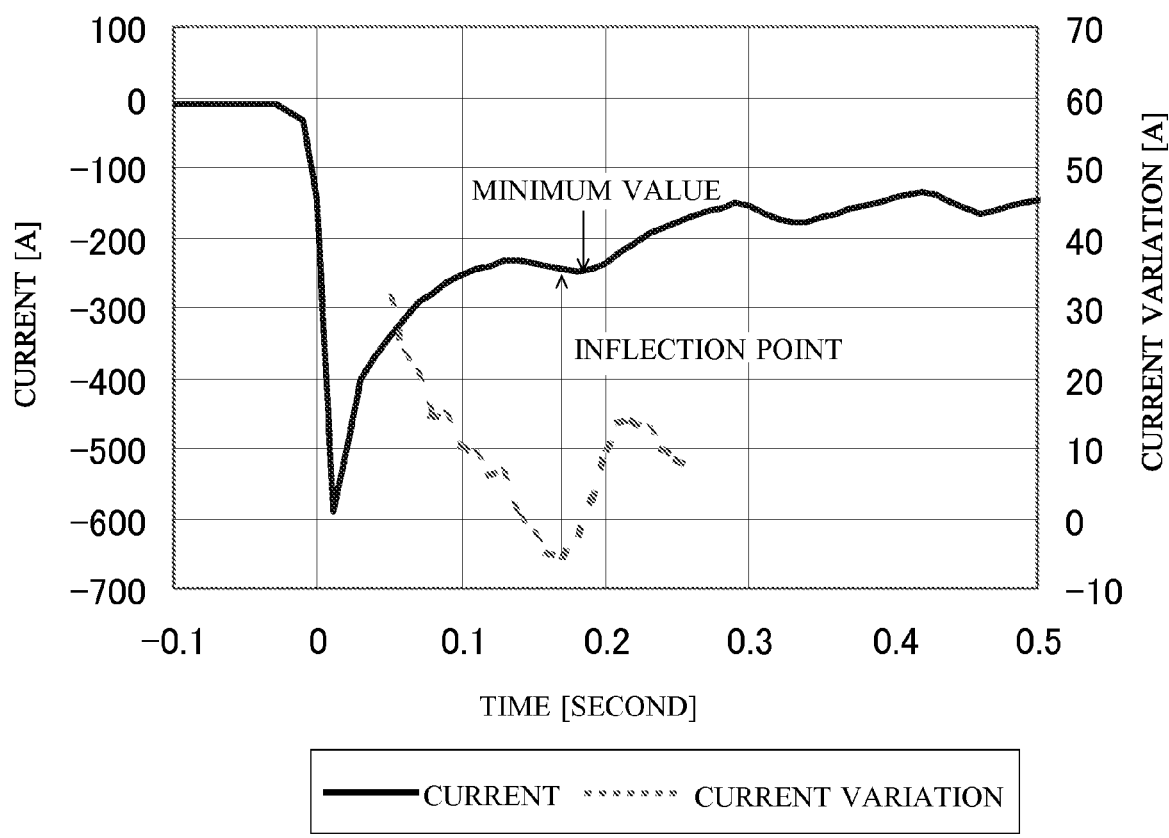
FIG. 5 is a view illustrating an example of the temporal change of the current at the starting time.
Figure 6:
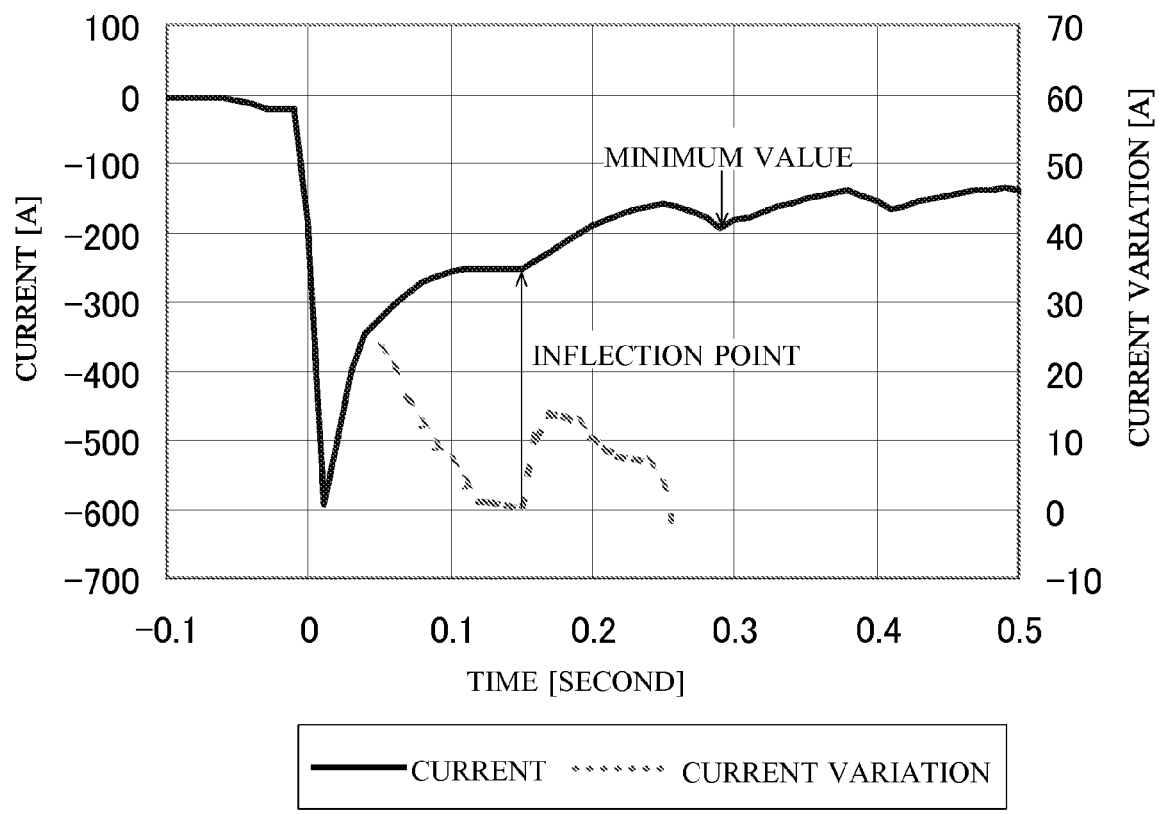
FIG. 6 is a view illustrating another example of the temporal change of the current at the starting time.

FIG. 5 and FIG. 6 are views illustrating examples of a current change at the starting time. In FIG. 5, the minimum value appears at around 0.2 seconds, and this minimum value is a timing reaching the maximum torque point in the cranking. On the other hand, in FIG. 6, a concavity is observed at around 0.15 seconds, but this concavity is not the minimum value because the current becomes a straight line state of which gradient is approximately "0" (zero) just before the concavity. However, the concavity at around 0.15 seconds actually is a timing when the current reaches the maximum torque point.

It is therefore necessary to detect the points not only in the case as illustrated in FIG. 5 but also in the case as illustrated in FIG. 6 to correctly detect the maximum torque point when the maximum torque is exhibited at the cranking time.

Accordingly, an extreme value of the current is detected and at the same time, an inflection point of the current is detected in the present embodiment. Here, the extreme value is a maximum value or a minimum value at a predetermined range. In an example in FIG. 5, the current in a direction flowing in the secondary battery 14 is set to be plus, and the current in a direction flowing out is set to be minus. Therefore, the current takes the minimum value at the timing reaching the top dead center. It goes without saying that the current takes the maximum value at a timing reaching the top dead center when the current flowing direction is defined in reverse. On the other hand, the inflection point is a point where a sign of a curvature changes on a curve.

In FIG. 5, the minimum value and the inflection point appear at approximately the same timing, and therefore, the minimum point is judged as the maximum torque point in the case as stated above. On the other hand, in FIG. 6, the minimum value and the inflection point appear at different timings. In this case, the inflection point is judged as the maximum torque point. Both of the extreme value and the inflection point are detected as stated above, and it is judged that the inflection point is the maximum torque point when these timings are separated, and thereby, it is possible to correctly judge the maximum torque point even in the case, for example, as illustrated in FIG. 6. Besides, it is judged that the extreme value is the maximum torque point when these timings are approximately the same, and thereby, it is possible to correctly detect the maximum torque point and to recognize that the maximum torque point is reliable based on a fact that these two timings are matched. Note that the extreme value is judged to be the maximum torque point when the timings of the extreme value and the inflection point are approximately the same, but it goes without saying that the inflection point may be judged to be the maximum torque point.

It is possible to surely find the maximum torque point and to accurately find the current at that time (starting current) according to the above-stated processes, and therefore, it is possible to accurately find the starting voltage based on the above-stated expression (1). Accordingly, it is possible to correctly judge whether or not the starting is possible based on the obtained starting voltage.

Next, detailed operations of the present embodiment are described with reference to FIG. 7. A flowchart illustrated in FIG. 7 is conducted by the CPU 10a reading and executing the programs 10ba illustrated in FIG. 2. When the flowchart illustrated in FIG. 7 is started, the following steps are executed.

In step S1, the CPU 10a judges whether or not the inrush current is detected, goes to step S2 when the inrush current is detected (step S1: Yes), and repeats the same process in the other cases (step S1: No). Specifically, when the electricity to the starter motor 18 is turned on, and the inrush current as illustrated in FIG. 3(A) is detected, the process goes to the step S2. Note that the inrush current can be judged when, for example, the current at a threshold value or more flows as a method detecting the inrush current. Specifically, in the example in FIG. 4 it is possible to use, for example, "−500 A" as the threshold value. It goes without saying that the threshold value other than this value can be used.

In the step S2, the CPU 10a starts the clocking by the timer 10d. Namely, the CPU 10a resets a count value of the timer 10d into "0" (zero), and starts a count operation.

In step S3, the CPU 10a obtains a value of the current flowing in the secondary battery 14 at that time from the current sensor 12 via the I/F 10f, and substitutes into a variable I1. Note that a direction flowing out from the secondary battery 14 is set to be minus and a direction flowing into is set to be plus in a measurement value of the current sensor 12 in this embodiment. It goes without saying that it may be defined in reverse.

In step S4, the CPU 10a obtains a value of the timer from the timer 10d at the timing when the current value is obtained, and substitutes into a variable T.

In step S5, the CPU 10a compares the variable I1 into which a most recent current value is substituted in the step S3 and a variable I2 into which a current value at a previous process is substituted in step S13, judges whether or not a relationship of I1<I2 holds, goes to step S6 when it is judged to hold (step 5: Yes), and goes to step S8 in the other cases (step S5: No). In more detail, it goes to the step S6 when the current value at this time is smaller than the current value at the previous time.

In the step S6, the CPU 10a substitutes the current value measured in the process at this time from the variable I1 to a variable Imin where the minimum value of the current is stored.

In step S7, the CPU 10a substitutes the value of the variable T being a counter value when the current value stored at the variable Imin is measured into a variable Tmin.

The value of the variable Imin is updated when the current value at this time is smaller than the current value at the previous time by the processes of the above-stated steps S5 to S7, and therefore, the minimum value of the current is to be stored at the variable Imin.

In the step S8, the CPU 10a substitutes a value obtained by subtracting the current value at the previous time from the current value at this time (=I1−I2) into a variable I3. As a result, a variation from the current value at the previous time to the current value at this time (current variation) is stored at the variable I3.

In step S9, the CPU 10a compares the value of the variable I3 where the current variation is stored in the step S8 and a value of a variable I4 where a current variation at the previous time is stored in the step S13, judges whether or not a relationship of I3<I4 holds, goes to step S10 when it is judged that it holds (step S9: Yes), and goes to step S12 in the other cases (step S9: No). In more detail, the CPU 10a goes to the step S10 when the current variation calculated at this time is smaller than the current variation calculated at the previous time.

In the step S10, the CPU 10a substitutes the value of the I1 being the current in the process at this time to a variable Iinf where the inflection point of the current is to be stored.

In step S11, the CPU 10a substitutes the value of the variable T being the counter value when the current stored at the variable Iinf is measured to a variable Tinf.

The inflection point is specified by finding the minimum value of the current variation by the processes of the above-stated steps S8 to S11, and the current value at the inflection point is to be stored at the variable Iinf.

In the step S12, the CPU 10a judges whether or not the process is to be finished, goes to step S14 when it is judged that the process is to be finished (step S12: Yes), and goes to the step S13 in the other cases (step S12: No). Specifically, for example, the CPU 10a refers to the count value of the timer 10d judges whether or not the count value is a predetermined threshold value or more, goes to the step S14 when the count value is the threshold value or more, and goes to the step S13 in the other cases. As a concrete value of the threshold value, for example, it is possible to use 0.5 seconds as the threshold value because the inflection point and the extreme value appear in most cases after 0.5 seconds or more elapses after the supply of current to the starter motor 18 is started. It goes without saying that a threshold value other than this can be used in accordance with a kind of a vehicle and a usage environment.

In the step S14, the CPU 10a calculates an absolute value of a difference between the variable Tmin where the timer value when the minimum value is detected is stored and the variable Tinf where the timer value when the inflection point is detected is stored (=|Tmin−Tinf|), goes to step S15 when the absolute value of the difference is less than a predetermined threshold value Th (step S14: Yes), and goes to step S16 in the other cases (step S14: No). In more detail, the CPU 10a goes to the step S15 when the extreme value and the inflection point are observed at approximately the same timing (when the difference of the timings of observations is less than the threshold value Th), and goes to the step S16 in the other cases.

In the step S15, the CPU 10a substitutes the value of the variable Imin where the minimum value of the current is stored to a variable Ist where the starting current is to be stored.

In the step S16, the CPU 10a substitutes the value of the variable Iinf where the value of the inflection point of the current is stored to the variable Ist where the starting current is to be stored.

In step S17, the CPU 10a finds a starting voltage Vs by adding a value obtained by multiplying the starting current Ist found in the step S15 or the step S16 by a value of an internal resistance R found when the engine 17 is stopped (=R×Ist) and a voltage before starting Vb of the engine 17. The starting voltage Vs found as stated above is notified to the ECU being a higher level device via the communication part 10e. In the ECU, it is possible to judge whether or not the engine 17 can be started or whether or not an exchange of the secondary battery 14 is necessary based on the starting voltage and the voltage of the secondary battery 14.

Note that it is also possible to use for a learning process of the internal resistance R and the starting current Ist by comparing the starting voltage Vs found in the step S17 and the starting voltage actually measured. Specifically, the starting voltage Vs calculated in the step S17 and the starting voltage actually measured are compared, and a learning process of parameters may be performed when an equivalent circuit model of the secondary battery 14 is set, and the learning process is performed by a Kalman filter and so on by using this equivalent circuit model.

As described above, in the present embodiment, the inflection point and the minimum value of the current at the starting time of the engine 17 are found, the minimum value is selected as the maximum torque point when the timings when the inflection point and the minimum value are observed are approximately the same (when the absolute value of the difference between these is less than the threshold value Th in the example in FIG. 7), the inflection point is selected as the maximum torque point in the other cases, and the starting voltage is found based on the above. Accordingly, for example, the minimum value is specified as the maximum torque point and the current at that time is set to be the starting current when an obvious minimum value exists as illustrated in FIG. 5. On the other hand, when the obvious minimum value does not exist as illustrated in FIG. 6, the inflection point is specified as the maximum torque point, and the current at that time is set to be the starting current. The curves represented by dotted lines in FIG. 5 and FIG. 6 represent the current variations. Incidentally, it is possible to detect the maximum torque point even in case of FIG. 6 by detecting an extreme value of the variation because the current variation has an obvious extreme value at the inflection point, and therefore, it is possible to accurately find the starting voltage even when the current does not have the extreme value.

(D) Description of Modified Embodiment

It should be noted that the above-described embodiment is just an example, and the present invention is not limited to the above-stated case. For example, in the above-stated embodiment, a case when the minimum value is used as the extreme value is exemplified to be described, but the maximum value may be used depending on a definition of the current flowing direction.

Besides, in the above-stated embodiment, the extreme value is selected to be set as the starting current when the timings of the inflection point and the extreme value are approximately matched, but the inflection point may be selected to be set as the starting current.

Besides, in the above-stated embodiment, the "voltage before starting" in the expression (1) is found by the actual measurement, but for example, a stable voltage estimated value in which a correction excluding an influence of polarization is performed can be used.

Besides, the processes in the flowchart illustrated in FIG. 7 are just an example, and the extreme value and the inflection point may be found by a method other than this. For example, it is judged whether or not the timings of the inflection point and the extreme value are near based on the clocking value of the timer 10d in the example illustrated in FIG. 7, but for example, a variable counting a loop of the process may be provided, and it may be judged based on a count value of this variable.

What is claimed is:

1. A secondary battery state detecting device detecting a state of a secondary battery mounted on a vehicle, comprising:
 a current detecting unit detecting a current value of a current flowing in the secondary battery;
 an extreme value detecting unit detecting a first extreme value of a current flowing in a starter motor after an inrush current flows from the secondary battery to the starter motor after electricity to the starter motor starting an engine is turned on based on the current value;
 an inflection point detecting unit detecting a first inflection point of the current flowing in the starter motor after the inrush current flows based on a minimum value of a variation of the current value per a predetermined time; and
 a calculation unit selecting the inflection point when timings when the extreme value and the inflection point are detected are separated for a predetermined time or more, and selecting either one of the extreme value or the inflection point in the other cases to set as a starting current, and calculating a starting voltage being a voltage necessary for starting the engine from the starting current, an internal resistance of the secondary battery, and a voltage before starting being a voltage of the secondary battery before the electricity to the starter motor is turned on.

2. The secondary battery state detecting device according to claim 1,
 wherein the calculation unit selects the extreme value to set as the starting current when the timings when the extreme value and the inflection point are detected are not separated for the predetermined time or more, and calculates the starting voltage from the starting current, the internal resistance of the secondary battery, and the voltage before starting of the secondary battery.

3. A secondary battery state detecting method detecting a state of a secondary battery mounted on a vehicle, comprising:
 a current detecting step detecting a current value of a current flowing in the secondary battery;
 an extreme value detecting step detecting a first extreme value of a current flowing in a starter motor after an inrush current flows from the secondary battery to the starter motor after electricity to the starter motor starting an engine is turned on based on the current value;
 an inflection point detecting step detecting a first inflection point of the current flowing in the starter motor after the inrush current flows based on a minimum value of a variation of the current value per a predetermined time; and
 a calculation step selecting the inflection point when timings when the extreme value and the inflection point are detected are separated for a predetermined time or more, and selecting either one of the extreme value or the inflection point in the other cases to set as a starting current, and calculating a starting voltage being a voltage necessary for starting the engine from the starting current, an internal resistance of the secondary battery, and a voltage before starting being a voltage of the secondary battery before the electricity to the starter motor is turned on.

4. The secondary battery state detecting method according to claim 3,
 wherein the calculation step further comprises selecting the extreme value to set as the starting current when the timings when the extreme value and the inflection point are detected are not separated for the predetermined time or more, and calculating the starting voltage from the starting current, the internal resistance of the secondary battery, and the voltage before starting of the secondary battery.

5. A system, comprising:
 means for detecting a current value of a current flowing in the secondary battery;
 means for detecting a first extreme value of a current flowing in a starter motor after an inrush current flows from the secondary battery to the starter motor after electricity to the starter motor starting an engine is turned on based on the current value;
 means for detecting a first inflection point of the current flowing in the starter motor after the inrush current flows based on a minimum value of a variation of the current value per a predetermined time; and
 means for selecting the inflection point when timings when the extreme value and the inflection point are detected are separated for a predetermined time or more, and selecting either one of the extreme value or the inflection point in the other cases to set as a starting current, and calculating a starting voltage being a voltage necessary for starting the engine from the starting current, an internal resistance of the secondary battery, and a voltage before starting being a voltage of the secondary battery before the electricity to the starter motor is turned on.

6. The system according to claim 5,
 wherein the means for selecting further comprises selecting the extreme value to set as the starting current when the timings when the extreme value and the inflection point are detected are not separated for the predetermined time or more, and calculating the starting voltage from the starting current, the internal resistance of the secondary battery, and the voltage before starting of the secondary battery.

\* \* \* \* \*